United States Patent [19]

Shimizu et al.

[11] 4,315,165

[45] Feb. 9, 1982

[54] FREQUENCY DIVIDER

[75] Inventors: Shyoichi Shimizu, Fujisawa; Ken-Ichi Torii, Yokohama, both of Japan

[73] Assignee: Tokyo Shibaura Denki Kabushiki Kaisha, Kawasaki, Japan

[21] Appl. No.: 94,987

[22] Filed: Nov. 16, 1979

[30] Foreign Application Priority Data

Nov. 21, 1978 [JP] Japan ............................ 53/143877

[51] Int. Cl.³ .................................... H03K 23/08
[52] U.S. Cl. ........................ 307/225 R; 307/291; 307/299 B
[58] Field of Search ............... 307/225 R, 299 B, 291

[56] References Cited

U.S. PATENT DOCUMENTS

| 3,029,352 | 4/1962 | Marshall | 307/225 R |
| 3,492,553 | 1/1970 | Gordon et al. | 307/225 R |
| 3,728,561 | 4/1973 | Brocker | 307/291 |
| 4,091,296 | 5/1978 | Suzuki et al. | 307/299 B |
| 4,209,715 | 6/1980 | Aoki | 307/291 |

Primary Examiner—John S. Heyman
Attorney, Agent, or Firm—Oblon, Fisher, Spivak, McClelland & Maier

[57] ABSTRACT

Disclosed is a frequency divider which includes a master flip-flop, transfer gate transistors for the master flip-flop, a slave flip-flop, transfer gate transistors for the slave flip-flop, and switching transistors to energize one of the master slave flip-flops in response to an input signal. Among transistors constituting the flip-flops and the transfer gate transistors in this frequency divider, each double-collector transistor serves as two transistors having base and emitter in common.

8 Claims, 8 Drawing Figures

FREQUENCY DIVIDER

This invention relates to a frequency divider including master and slave flip-flops.

Conventionally, there are provided frequency dividers using master and slave flip-flops that are composed of emitter-coupled transistors. The master and slave flip-flops severally include transfer gate transistors, whereby the operating state is transferred between the two flip-flops. These transfer gate transistors have their collectors respectively connected in common with the collectors of emitter-coupled transistors constituting the flip-flops. The base of a transfer gate transistor of one flip-flop is connected to the base of the other flip-flop. Also, each two transfer gate transistors are emitter-coupled. Further, a switching circuit to switch the direction of the state transfer between the two flip-flops in response to an input signal is connected to the common emitters of the respective flip-flop and transfer gate transistors. The switching circuit is formed of e.g. two emitter-coupled transistors whose bases are supplied with input signals, and whose collectors are connected to the common emitters of the flip-flops and transfer gate transistors. Naturally, the switching circuit is connected with transistors for biasing and current source.

Thus, in the frequency dividers employing the prior art master and slave flip-flops, the number of elements used, especially transistors, is large, and it is impossible to reduce the chip area in integrating such frequency dividers in multistage connection. Moreover, an increase of elements in number means so many variations in the characteristics of the elements, possibly causing some troubles.

The object of this invention is to provide a frequency divider with emitter-coupled master and slave flip-flops capable of high degree of integration with reduced number of elements used.

In order to attain the above object, the frequency divider of this invention comprises at least a first flip-flop circuit including a first double-collector transistor and a second double-collector transistor whose first collector is connected to the base of the first transistor, whose base is connected to the first collector of the first transistor, and whose emitter is connected to the emitter of the first transistor, at least a second flip-flop circuit including a third double-collector transistor whose first collector is connected to a second collector of the first transistor, and a fourth double-collector transistor whose first collector is connected to the base of the third transistor and a second collector of the second transistor, whose base is connected to the first collector of the third transistor, and whose emitter is connected to the emitter of the third transistor, an output means connected to the first collectors of transistors included in any one flip-flop circuit out of the first and second flip-flop circuits, and an input means for selectively energizing one of the first and second flip-flop circuits in response to an input signal.

This invention can be more fully understood from the following detailed description when taken in conjunction with the accompanying drawings, in which.

Figure 1:
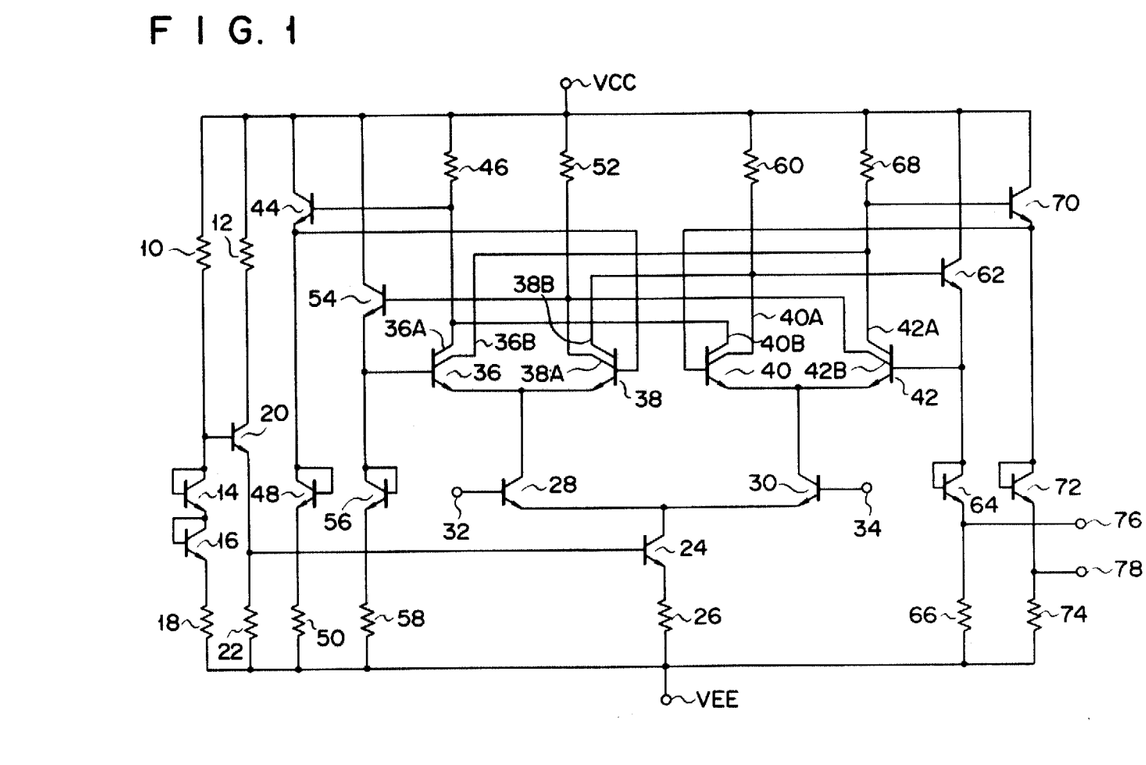
FIG. 1 is a circuit diagram showing a ½ frequency divider according to an embodiment of the invention.

Now there will be described an embodiment of the frequency divider according to this invention with reference to the accompanying drawings. In FIG. 1 showing a circuit diagram of the ½ frequency divider, a positive terminal VCC of an external power source (not shown) is connected to one end of each of resistors 10 and 12. The other end of the resistor 10 is connected to a negative terminal VEE through the collector-emitter paths of NPN-type transistors 14 and 16 serving as diodes whose collector-base paths are shorted and through a resistor 18. All of transistors included in this frequency divider are of an NPN type. The other end of the resistor 12 is connected to the collector of a transistor 20. The transistor 20 has its base connected to the junction of the resistor 10 and the transistor 14, and emitter connected to the negative terminal VEE via a resistor 22. The resistors 10, 12, 18, 22 and 26 and the transistors 14, 16, 20 and 24 constitute a bias circuit. The bias circuit is one embodiment, the transistors may be replaced by a resistor connected between the emitters of the transistors 28, 30 and the negative terminal $V_{EE}$. The emitter of the transistor 20 is connected to the base of a transistor 24. The emitter of the transistor 24 is connected to the negative terminal VEE through a resistor 26, the transistor 24 and resistor 26 constituting a constant-current source circuit. The collector of the transistor 24 is connected to the emitters of transistors 28 and 30. Input terminals 32 and 34 are connected respectively to the bases of the emitter-coupled transistors 28 and 30. These emitter-coupled transistors 28 and 30 constitute a switching circuit which is turned on and off by their base potentials.

The collector of the transistor 28 is connected to the emitters of emitter-coupled transistors 36 and 38, while the collector of the transistor 30 is connected to the emitters of emitter-coupled transistors 40 and 42. The transistors 36, 38, 40 and 42 are all double-collector transistors. A first collector 36A of the transistor 36 is connected to the base of a transistor 44, and also to the positive terminal VCC through a load resistor 46. The transistor 44 has its collector connected to the positive terminal VCC, and emitter connected to the negative terminal VEE through the collector-emitter path of a transistor 48 serving as a diode whose collector-base path is shorted and a resistor 50, and also connected to the base of the transistor 38. A first collector 38A of the transistor 38 is connected to the positive terminal VCC through a load resistor 52 and also to the base of a transistor 54. The transistor 54 has its collector connected to the positive terminal VCC, and emitter connected to the negative terminal VEE through the collector-emitter path of a transistor 56 serving as a diode whose collector-base path is shorted and a resistor 58, and also connected to the base of the transistor 36. These transistors 36 (first collector), 44, 38 (first collector) and 54 constitute a master flip-flop. The emitter follower transistors 44 and 54 are intended for the acceleration of operation. A second collector 36B of the transistor 36 is connected to a first collector 42A of the transistor 42, while a second collector 38B of the transistor 38 is connected to a first collector 40A of the transistor 40, the transistors 36 and 38 (second collectors) serving as transfer gate transistors for the master flip-flop.

On the other hand, the first collector 40A of the transistor 40 is connected to the positive terminal VCC through a load resistor 60, and also to the base of a transistor 62. The transistor 62 has its collector connected to the positive terminal VCC, and emitter connected to the negative terminal VEE through the collector-emitter path of a transistor 64 serving as a diode whose collector-base path is shorted and a resistor 66, and also connected to the base of the transistor 42. The first collector 42A of the transistor 42 is connected to the positive terminal VCC through a load resistor 68 and also to the base of a transistor 70. The transistor 70 has its collector connected to the positive terminal VCC, and emitter connected to the negative terminal VEE through the collector-emitter path of a transistor 72 serving as a diode whose collector-base path is shorted and a resistor 74, and also connected to the base of the transistor 40. These transistors 40 (first collector), 62, 42 (first collector) and 70 constitute a slave flip-flop. The emitter follower transistors 62 and 70 are intended for the acceleration of operation. A second collector 40B of the transistor 40 is connected to the first collector 36A of the transistor 36, while a second collector 42B of the transistor 42 is connected to the first collector 38A of the transistor 38, the collectors 40 and 42 (second collectors) serving as transfer gate transistors for the slave flip-flop. The emitters of the transistors 64 and 72 using as a loads of the emitter follower of the slave flip-flop are connected to output terminals 76 and 78, respectively.

Figure 2:
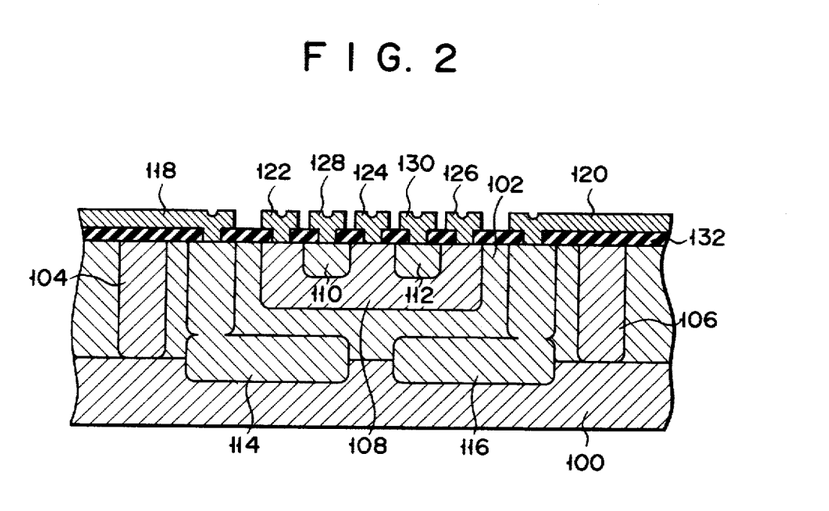
FIG. 2 is a cross-sectional view of a double-collector transistor in the frequency divider of FIG. 1 embodying the invention.

Referring now to the drawing of FIG. 2, there will be described a specific arrangement of the double-collector transistors 36, 38, 40 and 42. FIG. 2 is a sectional view of a double-collector transistor. An n-type layer 102 with low impurity concentration is formed on a substrate 100 of p-type silicon by epitaxial growth. The n-type epitaxial layer 102 is separated into several insular regions by p+-type layers 104 and 106 with high impurity concentration that are formed by diffusion to a depth reaching the substrate 100. A p-type layer 108 is formed by diffusion in the surface area of one of the insular regions 102. N+-type layers 110 and 112 with high impurity concentration are formed by diffusion in the surface area of the p-type layer 108. Between the p-type substrate 100 and the n-type insular region 102 lie first and second n+-type buried layers 114 and 116 which are buried separately from each other. The respective one-side ends of the buried layers 114 and 116 are joined to n+-type layers which are formed by diffusion from the surface independently of the buried layers, the n+-type diffusion layers being connected respectively to first and second collector electrodes 118 and 120. In order to reduce the base resistance, the p-type diffusion layer 108 is connected to three base electrodes 122, 124 and 126, which are externally connected in common. In order to enlarge the length of periphery of emitter region to enable high-frequency operation, the n+-type diffusion layers 110 and 112 are connected respectively to emitter electrodes 128 and 130, which are externally connected in common. Further, an SiO2 film 132 is formed on the surface of the n-type epitaxial layer 102 except the electrode takeout portions.

Figure 3:
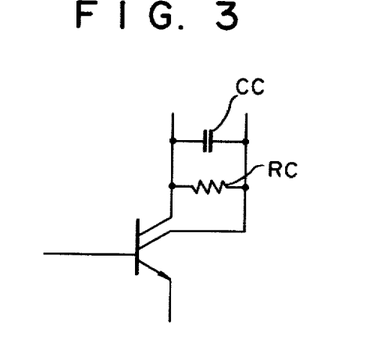
FIG. 3 shows an equivalent circuit diagram of the double-collector transistor shown in FIG. 2.

Hereupon, the first and second n+-type buried layers 114 and 116 are not entirely electrically disconnected from each other but are connected by means of the n-type epitaxial layer 102. In an equivalent circuit diagram of the double-collector transistor, as shown in FIG. 3, a resistor RC and a capacitor CC are coupled between the first and second collectors. However, if the value of the resistor RC is higher enough than the load resistors 46, 52, 60 and 68, then the two collectors will function independently of each other. For example, if the specific resistance of the n-type epitaxial layer 102 is 2 Ω/cm, the thickness X of the n-type epitaxial layer 102 from the bottom of the p-type base layer 108 to the top of the p-type substrate 100 is $X = 3.5$ μm, the distance Y between the first and second n+-type buried layers 114 and 116 is $Y = 20$ μm, and that the length of the buried layers (at right angles to the plane of FIG. 2) is 45 μm, then the resistance value RC of FIG. 3 is approximately 2 KΩ.

The capacitance CC is approximately expressed as the sum of the junction capacitance between the substrate 100 and the buried layer 114 and the junction capacitance between the base layer 108 and the epitaxial layer 102. In this case, both junctions are greatly reverse-viased, then the junction capacitances have very small values (smaller than 1 PF). Moreover, resistors whose value are very great (not shown) are connected in series with the capacitors respectively, so the effect of the capacitors become smaller. Accordingly, if the load resistors 46, 52, 60 and 68 are set at 360 Ω, for example, the effects of the resistance RC and capacitor CC will die away, allowing the transistor to operate satisfactorily as a double-collector transistor.

Now there will be described the operation of thus constructed frequency divider.

First, let it be supposed that such an input signal is applied to the input terminals in a first step that the input terminals 32 and 34 may be brought to high and low levels, respectively. Then, the transistor 28 is caused to conduct. Here let us suppose that the base potentials of the transistors 36 and 38 are not wholly equal, the base potential of the transistor 38 is a little higher. Then, the transistor 36 is turned off, and the transistor 38 is turned on. Current flows from the positive terminal VCC to the first collector 38A of the transistor 38 through the load resistor 52, and to the second collector 38B of the transistor 38 through the load resistor 60, and from the emitter of the transistor 38 to the negative terminal VEE through the transistors 28 and 24 and the resistor 26. The emitter potentials of the transistors 54 and 62 become low because their base potentials become low respectively by voltage drops at the load resistor 52 and 60. On the other hand, the emitter potentials of transistors 44 and 70 become high because their base potentials become high. Since the emitter potential of the transistor 62 is low, the base potential of the transistor 42 become low, and a low-level signal is generated from the output terminal 76. Since the emitter potential of the transistor 70 is high, the base potential of the transistor 40 becomes high, and a high-level signal is generated from the output terminal 78. The base potential of the transistor 42 becomes low because the emitter potential of the transistor 62 is low, the base potential of the transistor 40 becomes high because the emitter potential of the transistor 70 is high.

Then, in a second step, the levels of the input terminals 32 and 34 are switched to cause the transistor 30 to conduct. Since the base potential of the transistor 40 is higher than that of the transistor 42 according to the state of the first step, the transistor 40 is turned on.

Current flows from the positive terminal VCC to the first and second collectors 40A and 40B of the transistor 40 through the load resistors 60 and 46 respectively, and from the emitter of the transistor 40 to the negative terminal VEE through the transistors 30 and 24 and the resistor 26. The emitter potentials of the transistors 44 and 62 become low because their base potentials are low respectively by voltage drops at the load resistors 46 and 60. On the other hand, the emitter potentials of the transistors 54 and 70 become high because their base potentials are high. Since the emitter potential of the transistor 62 is low, the base potential of the transistor 42 becomes low, and a low-level signal is generated from the output terminal 76. Since the emitter potential of the transistor 70 is high, the base potential of the transistor 40 becomes high, and a high-level signal is generated from the output terminal 78. Further, since the emitter potential of the transistor 44 is low, the base potential of the transistor 38 becomes low. Since the emitter potential of the transistor 54 is high, the base potential of the transistor 36 becomes high.

In a third step, moreover, the levels of the input terminals 32 and 34 are switched to cause the transistor 28 to conduct. Since the transistor 36 is on according to the state of the second step, current flows from the positive terminal VCC to the first and second collectors 36A and 36B of the transistor 36 through the load resistors 46 and 68 respectively, and from the emitter of the transistor 36 to the negative terminal VEE through the transistors 28 and 24 and the resistor 26. The emitter potentials of the transistors 44 and 70 become low since their base potentials become low respectively by voltage drops at the load resistors 46 and 68. The emitter potentials of the transistors 54 and 62 become high because their base potentials are high. Since the emitter potential of the transistor 62 is high, the base potential of the transistor 42 becomes high, and a high-level signal is generated from the output terminal 76. Since the base potential of the transistor 70 becomes low, the base potential of the transistor 40 becomes low, and a low-level signal is generated from the output terminal 78. The base potential of the transistor 40 becomes low since the emitter potential of the transistor 70 is low, and the base potential of the transistor 42 becomes high since the emitter potential of the transistor 62 is high.

In a fourth step, furthermore, the levels of the input terminals are switched to cause the transistor 30 to conduct. Since the transistor 42 is on according to the state of the third step, curvont flows from the positive terminal VCC to the first and second collectors 42A and 42B of the transistor 42 through the load resistors 68 and 52 respectively, and from the emitter of the transistor 42 to the negative terminal VEE through the transistors 30 and 24 and the resistor 26. The emitter potentials of the transistors 54 and 70 become low since their base potentials become low respectively by voltage drops at the load resistors 52 and 68. The emitter potentials of the transistors 44 and 62 become high because their base potentials are high. Since the emitter potential of the transistor 62 is high, the base potential of the transistor 42 becomes high, and a high-level signal is generated from the output terminal 76. Since the emitter potential of the transistor 70 is low, the base potential of the transistor 40 becomes low, and low-level signal is generated from the output terminal 78. Further, since the emitter potential of the transistor 44 is high, the base potential of the transistor 38 becomes high. Since the emitter potential of the transistor 54 is low, the base potential of the transistor 36 becomes low.

Subsequently, when the levels of the input terminals are switched to cause the transistor 28 to conduct, the same state of the first step is resumed, and the four steps are successively repeated thereafter. Hereupon, the level change at the output terminals is made with every other step; the level of each output terminal changes once while the level of each input terminal changes twice. Thus, a frequency $\frac{1}{2}$ divided is obtained. According to this embodiment, as compared with the prior art frequency divider, the number of transistors constituting the flip-flops may be halved, and the switching circuit may be used in common, so that the number of elements used can be reduced. Even in integrating multistage-connected frequency dividers, therefore, the chip area may be reduced.

Figure 4:
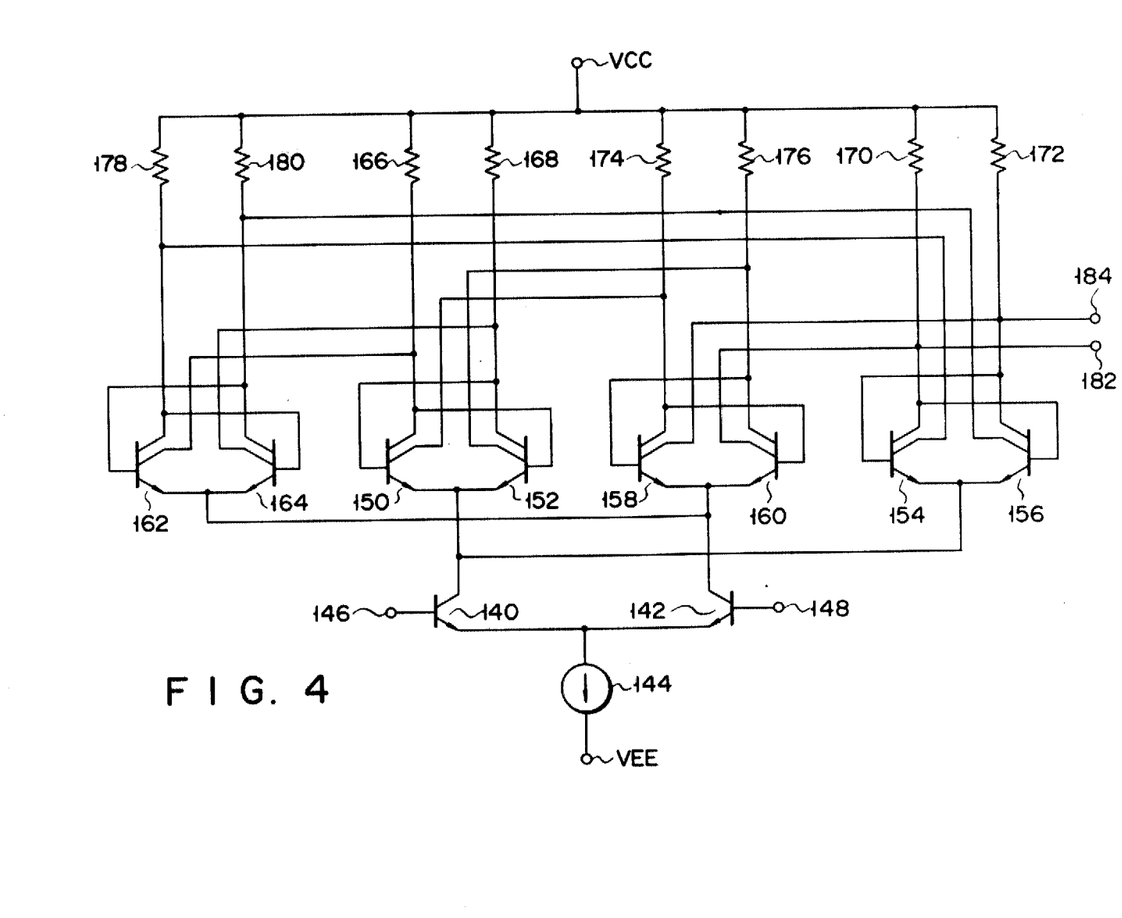
FIG. 4 is a circuit diagram showing a ¼ frequency divider according to another embodiment of this invention.

Referring now to FIG. 4, there will be described a $\frac{1}{4}$ frequency divider as a second embodiment of the frequency divider of this invention. The common emitter of emitter-coupled transistors 140 and 142 constituting a switching circuit is connected to a negative terminal VEE through a constant-current source 144. The constant-current source 144 is equivalent to the bias circuit plus the current source transistor 24 of FIG. 1. The collector of the transistor 140 is connected to the emitters of emitter-coupled transistors 150 and 152 and the emitters of emitter-coupled transistors 154 and 156. The collector of the transistor 142 is connected to the emitters of emitter-coupled transistors 158 and 160 and the emitters of emitter-coupled transistors 162 and 164. The transistors 150, 152, 154, 156, 158, 160, 162 and 164 are all double-collector transistors. The first collector of one transistor 150 out of one pair of emitter-coupled transistors is connected to a positive terminal VCC through a load resistor 166, and also connected to the base of the other transistor 152. The first collector of the transistor 152 is connected to the positive terminal VCC through a load resistor 168, and also connected to the base of the transistor 150. A flip-flop is formed by these connections. The other pairs of emitter-coupled transistors are connected in the same manner, thereby forming flip-flops. The second collectors of each pair of emitter-coupled transistors are connected respectively to the first collectors of adjacent pairs of emitter-coupled transistors, thus constituting transfer gate transistors. The first collectors of the transistors 154 and 156 are connected to output terminals 182 and 184, respectively.

Now there will be described the operation of the above-mentioned $\frac{1}{4}$ frequency divider. First, let it be supposed that such an input signal is applied to input terminals in a first step that input terminals 146 and 148 may be brought to low and high levels, respectively. Then, the transistor 142 is caused to conduct. Here let us suppose that the base potentials of the transistors 158 and 160 are not wholly equal; the base potential of the transistor 160 is a little higher. Likewise, the base potentials of the transistors 162 and 164 are not wholly equal; the base potential of the transistor 162 is a little higher. Then, the transistors 160 and 162 are caused to conduct, so that current flows from the positive terminal VCC to the first and second collectors of the transistor 160 and the first and second collectors of the transistor 162 through load resistors 176, 170, 178 and 166, respectively. By a voltage drop at the load resistor 170, the level of the output terminal 182 goes low and since the current flows through a load resistor 172 is prohibited, the level of the output terminal 184 goes high. In consequence, the potential at the base of the transistor 156 which is connected to the load resistor 170 becomes low, while the potential at the base of the transistor 154 which is connected to the load resistor 172 becomes high. Similarly, by a voltage drop at the load resistor 166, the potential at the base of the transistor 152 becomes low, while the potential at the base of the transistor 150 becomes high.

In a second step, the levels of the input terminals are switched to cause the transistor 140 to conduct. At this time, the transistors 150 and 154 are on according to the state of the first step, so that current flows from the positive terminal VCC to the first and second collectors of the transistor 150 and the first and second collectors of the transistor 154 through the load resistors 166, 174, 170 and 178, respectively. Due to the voltage drop at the load resistor 170, the level of the output terminal 182 is low, prohibiting current from flowing through the load resistor 172, so that the level of the output terminal 184 is high. By a voltage drop at the load resistor 174, the base potential of the transistor 160 becomes low, while the base potential of the transistor 158 becomes high. Likewise, by a voltage drop at the load resistor 178, the base potentials of the transistors 164 and 162 become low and high, respectively.

In a third step, the levels of the input terminals are switched to cause the transistor 142 to conduct. At this time, the transistors 160 and 162 are on according to the state of the second step, so that current flows from the positive terminal VCC to the first and second collectors of the transistor 158 and the first and second collectors of the transistor 162 through the load resistors 174, 172 and 178 and 166, respectively. Due to the voltage drop at the load resistor 172, the level of the output terminal 184 is low, and the level of the output terminal 182 is high. By voltage drops at the load resistors 172 and 166, the base potentials of the transistors 154 and 152 become low, while those of the transistors 156 and 150 become high.

In a fourth step, the levels of the input terminals are switched to cause the transistor 140 to conduct. At this time, the transistors 150 and 156 are on according to the state of the third step, so that current flows from the positive terminal VCC to the first and second collectors of the transistor 150 and the first and second collectors of the transistor 156 through the load resistors 166, 174, 172 and 180. Due to the voltage drop at the load resistor 172, the level of the output terminal 184 is low, and the level of the output terminal 182 is high. By voltage drops at the load resistors 174 and 180, the base potentials of the transistors 160 and 162 become low, while those of the transistors 158 and 164 become high.

In a fifth step, the levels of the input terminals are switched to cause the transistor 142 to conduct. At this time, the transistors 158 and 164 are on according to the state of the fourth step, so that current flows from the positive terminal VCC to the first and second collectors of the transistor 158 and the first and second collectors of the transistor 164 through the load resistors 174, 172, 180 and 168, respectively. Then, by a voltage drop at the load resistor 172, the level of the output terminal 184 goes low, while the level of the output terminal 182 goes high. By voltage drops at the load resistors 168 and 172, the base potentials of the transistors 150 and 154 become low, and those of the transistors 152 and 156 become high.

In a sixth step, the levels of the input terminals are switched to cause the transistor 140 to conduct. At this time, the transistors 152 and 156 are on according to the state of the fifth step, so that current flows from the positive terminal VCC to the first and second collectors of the transistor 152 and the first and second collectors of the transistor 156 through the load resistors 168, 176, 172 and 180, respectively. Due to the voltage drop at the load resistor 172, the level of the output terminal 184 is low, and the level of the output terminal 182 is high. By voltage drops at the load resistors 176 and 180, the base potentials of the transistors 158 and 162 become low, and those of the transistors 160 and 164 become high.

In a seventh step, the levels of the input terminals are switched to cause the transistor 142 to conduct. At this time, the transistors 160 and 164 are on according to the state of the sixth step, so that current flows from the positive terminal VCC to the first and second collectors of the transistor 160 and the first and second collectors of the transistor 164 through the load resistances 176, 170, 180 and 168, respectively. Due to the voltage drop at the load resistor 170, the level of the output terminal 182 is low, and the level of the output terminal 184 is high. By voltage drops at the load resistors 170 and 168, the base potentials of the transistors 156 and 150 become low, and those of the transistors 154 and 152 become high.

In a eighth step, the levels of the input terminals are switched to cause the transistor 140 to conduct. At this time, the transistors 154 and 152 are on according to the state of the seventh step, so that current flows from the positive terminal VCC to the first and second collectors of the transistor 154 and the first and second collectors of the transistor 152 through the load resistors 170, 178, 168 and 176, respectively. Due to the voltage drop at the load resistor 170, the level of the output terminal 182 is low, and the level of the output terminal 184 is high. By voltage drops at the load resistors 176 and 178, the base potentials of the transistors 158 and 164 become low, and those of the transistors 160 and 162 become high.

Subsequently, when the levels of the input terminals are switched to cause the transistor 142 to conduct, the same state of the first step is resumed, and the eighth steps are successively repeated thereafter. Hereupon, the level change at the output terminals is made with every four steps; the level of each output terminal changes once while the level of each input terminal changes four times. Thus, a frequency ¼ divided is obtained.

This invention is not limited to the above-mentioned embodiments, and ⅛ or ½ frequency dividers may also be connected in many stages. As for the construction of the double-collector transistor, it is not limited to the embodiment of FIG. 2, and may be replaced by various arrangements as shown in FIGS. 5 to 8. In these drawings, like reference numerals refer to the same parts as shown in FIG. 2, and detailed description of such parts will be omitted.

Figure 5:
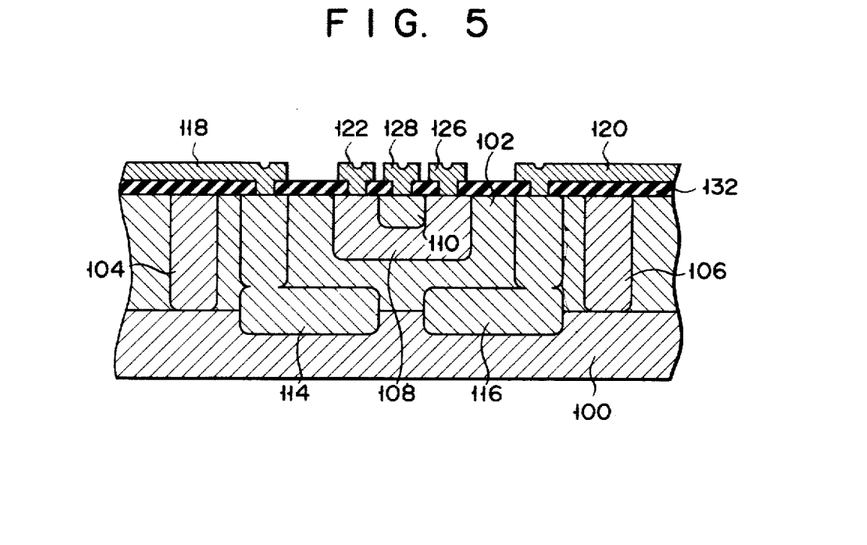
FIGS. 5 to 8 are cross-sectional views of other double-collector transistors embodying the invention.

In a double-collector transistor shown in FIG. 5, only a single n+-type emitter layer 110 is formed by diffusion in the surface area of a p-type base layer 108. Thus, the emitter region is halved, and the elements are further improved in compactness. This arrangement may, however, be somewhat inferior to the one shown in FIG. 2 in high-frequency performance, though there is hardly any difference between their capabilities unless the current flow is very large.

Figure 6:
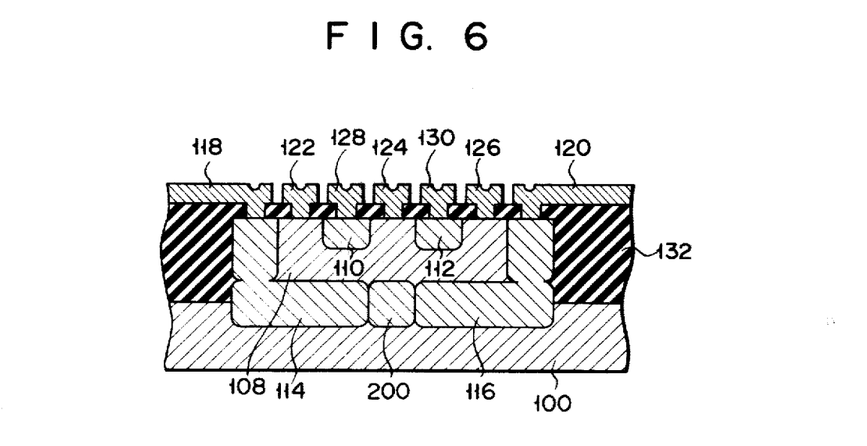

Alternatively, there may be used a planar transistor as shown in FIG. 6, in which n+-type collector layers 114 and 116 are independently buried in the surface region of a p-type substrate 100. An n-type layer 200 is buried between the n+-type layers 114 and 116, whereby the capacitance and resistance between the collctors may be reduced in accordance. The adjacent elements are insulated by the SiO$_2$ film 132 reached to the p-type substrate 100. Thus, the operating speed may be increased by eliminating the occurance of the parasitic capacitors between the collector layers 114, 116 and the SiO$_2$ film 132.

Figure 7:
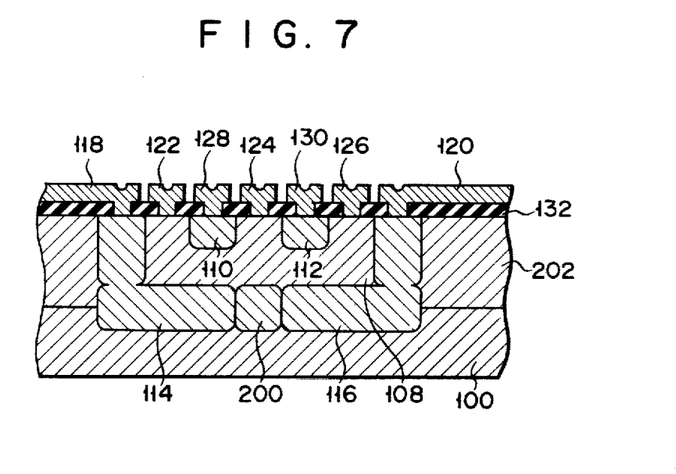

Also in a transistor of collector-diffusion-isolation (CDI) structure as shown in FIG. 7, the resistance between both collectors may be controlled in accordance with the concentration of an n-type layer 200. In this case, a p-type layer 202 is epitaxially grown on a p-type substrate 100, and n+-type collector layers 114 and 116 are buried in the surface region of the p-type substrate 100.

Figure 8:
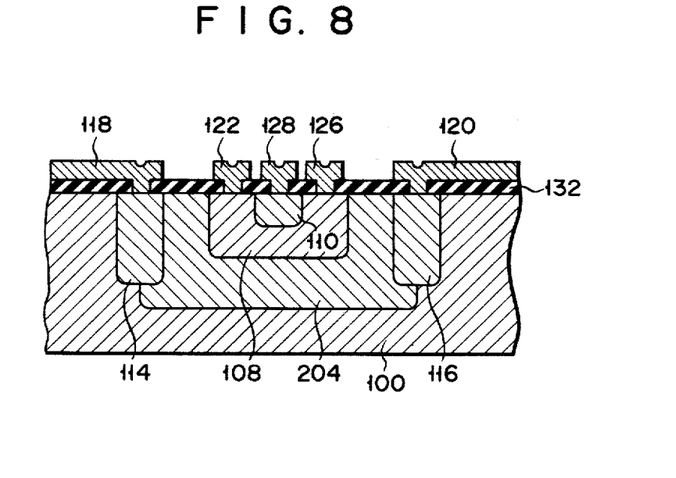

Furthermore, there may alternatively be used a transistor of triple-diffusion structure as shown in FIG. 8. In this transistor, an n-type layer 204 is formed by diffusion in the surface region of a p-type substrate 100, and n+-type layers 114 and 116 are formed by diffusion at both ends of the n-type layer 204, respectively, constituting first and second collector layers.

What we claim is:

1. A frequency divider comprising:
   a first flip-flop circuit including a first double collector transistor and a second double collector transistor having its first collector connected to the base of said first double collector transistor, its emitter connected to the emitter of said first double collector transistor and its base connected to a first collector of said first double collector transistor;
   a second flip-flop circuit including a third double collector transistor having its first collector connected to a second collector of said second double collector transistor and its second collector connected to the first collector of said first double collector transistor and a fourth double collector transistor having its first collector connected to a second collector of the first double collector transistor and to the base of said third double collector transistor, its second collector connected to the first collector of said second double collector transistor, its base connected to the first collector of said third double collector transistor and its emitter connected to the emitter of said third double collector transistor;
   input means for selectively energizing one of said first and second flip-flop circuits in response to an input signal; and
   output means coupled to the first collectors of transistors in any one of said first and second flip-flop circuits;
   wherein each of said first through fourth double collector transistors comprises
   a semiconductor substrate of a first conductivity type,
   a first semiconductor region of a second conductivity type formed in the surface area of said substrate,
   two buried layers of the second conductivity type formed between said substrate and first semiconductor region and having an impurity higher than the impurity of said first semiconductor region and, the portion of said buried layers reaching the surface of said first semiconductor region and said buried layers acting as first and second collectors,
   a second semiconductor region of the first conductivity type formed in the surface area of said first semiconductor region, said second semiconductor region acting as the base, and
   a third semiconductor region of the second conductivity type formed in the surface area of said second semiconductor region, said third semiconductor region acting as the emitter.

2. A frequency divider according to claim 1, wherein said first collectors of said first through fourth double collector transistors are connected to a voltage terminal through resistor means.

3. A frequency divider according to claim 1, wherein said output means includes emitter follower transistors connected to said respective first collectors and output terminals connected to the respective emitters of said emitter follower transistors.

4. A frequency divider according to claim 1, wherein said input means includes emitter-coupled transistors whose collectors are connected respectively to the common emitters of the transistors constituting said first and second flip-flop circuits, input terminals connected respectively to the bases of said emitter-coupled transistors, and a current source circuit whose one end is connected to the common emitters of said emitter-coupled transistors and whose other end is connected to a negative terminal.

5. A frequency divider comprising:
   first and second frequency dividing means each having first and second flip-flop circuits, said first flip-flop circuit including a first double collector transistor and a second double collector transistor having its first collector connected to the base of said first double collector transistor, its base connected to a first collector of said first double collector transistor and its emitter connected to the emitter of said first double collector transistor, said second flip-flop circuit including a third double collector transistor having its first collector connected to a second collector of said first double collector transistor and its base connected to a second collector of said second double collector transistor and a fourth double collector transistor having its first collector connected to the second collector of said second double collector transistor and to the base of said third double collector transistor, its base connected to the second collector of said first double collector transistor and to the first collector of said third double collector transistor and its emitter connected to the emitter of said third double collector transistor, said second collectors of said third and fourth double collector transistors in said first frequency dividing means being connected to the first collectors of said first and second double collector transistors, respectively, in second frequency divider;
   input means for selecting said first flip-flop circuits or said second flip-flop circuits of the first and second frequency dividers according to an input signal; and
   output means connected to the first collectors of said third and fourth double collector transistors.

6. A frequency divider according to claim 5, wherein said first collectors of said first through fourth double collector transistors in said first and second frequency divider means are connected to a voltage terminal through resistor means.

7. A frequency divider according to claim 5, wherein said output means includes emitter follower transistors connected to said respective first collectors and output terminals connected to the respective emitters of said emitter follower transistors.

8. A frequency divider according to claim 5, wherein said input means includes emitter-coupled transistors whose collectors are connected respectively to the common emitters of the transistors consituting said first and second flip-flop circuits, input terminals connected respectively to the bases of said emitter-coupled transistors, and a current source circuit whose one end is connected to the common emitters of said emitter-coupled transistors and whose other end is connected to a negative terminal.

* * * * *